United States Patent
Delchevalrie et al.

(10) Patent No.: US 11,898,239 B2
(45) Date of Patent: Feb. 13, 2024

(54) TREATMENT OF A THIN FILM BY HYDROGEN PLASMA AND POLARISATION IN ORDER TO IMPROVE THE CRYSTALLINE QUALITY THEREOF

(71) Applicant: COMMISSARIAT A L'ENERGIE ATOMIQUE ET AUX ENERGIES ALTERNATIVES, Paris (FR)

(72) Inventors: Julien Delchevalrie, Gif sur Yvette (FR); Jean-Charles Arnault, Rambouillet (FR); Samuel Saada, Antony (FR); Romain Bachelet, Villeurbanne (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/642,530

(22) PCT Filed: Sep. 11, 2020

(86) PCT No.: PCT/FR2020/051573
§ 371 (c)(1),
(2) Date: Mar. 11, 2022

(87) PCT Pub. No.: WO2021/048507
PCT Pub. Date: Mar. 18, 2021

(65) Prior Publication Data
US 2022/0325405 A1 Oct. 13, 2022

(30) Foreign Application Priority Data
Sep. 13, 2019 (FR) ..................... 19 10128

(51) Int. Cl.
C23C 14/58 (2006.01)
H01L 21/321 (2006.01)
C23C 16/27 (2006.01)

(52) U.S. Cl.
CPC ........ *C23C 14/5826* (2013.01); *C23C 14/584* (2013.01); *H01L 21/321* (2013.01); *C23C 16/279* (2013.01)

(58) Field of Classification Search
None
See application file for complete search history.

(56) References Cited

U.S. PATENT DOCUMENTS

| | | | |
|---|---|---|---|
| 2007/0084398 A1 | 4/2007 | Schreck et al. | |
| 2007/0209578 A1* | 9/2007 | Noguchi | H01L 21/02658 257/E21.104 |
| 2011/0256347 A1* | 10/2011 | Manuad | C23C 16/0272 216/37 |
| 2013/0224396 A1* | 8/2013 | Furusho | H01L 21/02689 427/535 |
| 2019/0148217 A1* | 5/2019 | Moser | H01L 21/02667 257/620 |

FOREIGN PATENT DOCUMENTS

| | | | |
|---|---|---|---|
| DE | 102017205417 A1 | * | 10/2018 |
| JP | 2005-335988 A | | 12/2005 |
| JP | 2005335988 A | * | 12/2005 |

OTHER PUBLICATIONS

Golding et al. "Diamond heteroepitaxy: pattern formation and mechanisms". Diamond and Related Materials (2004) p. 545-551 (of record, hereafter "Golding"). (Year: 2004).*
International Search Report dated Dec. 16, 2020 in PCT/FR2020/051573 filed Sep. 11, 2020, 2 pages.
Preliminary French Search Report dated Jul. 29, 2020 in French Patent Application No. 1910128 filed Sep. 13, 2019, 2 pages (with Translation of Category of cited Documents).
Golding, B., et al., "Diamond heteroepitaxy, pattern formation and mechanisms", Diamond and Related Materials, vol. 13, No. 4-8, XP004507819, 2004, pp. 545-551.

* cited by examiner

*Primary Examiner* — Jose I Hernandez-Kenney
(74) *Attorney, Agent, or Firm* — Oblon, McClelland, Maier & Neustadt, L.L.P.

(57) ABSTRACT

Methods for treating a thin film made from a conductive or semiconductive material may improve the crystalline quality thereof. Such methods may include: supplying a substrate including, on one of the faces thereof, a thin film of the material; and biased plasma treating the assembly formed by the substrate and the thin film at a given temperature and for a given time, so as to obtain a crystalline reorganization over a depth of the thin film, the biased plasma treatment including an electrical biasing of the thin film and an exposure of the film thus biased to a hydrogen plasma, the biased plasma treatment being implemented at a temperature that is below the melting points of the thin film and of the substrate.

20 Claims, 12 Drawing Sheets

TREATMENT OF A THIN FILM BY HYDROGEN PLASMA AND POLARISATION IN ORDER TO IMPROVE THE CRYSTALLINE QUALITY THEREOF

CROSS-REFERENCE TO RELATED APPLICATIONS

The present application is the national stage of international application PCT/FR2020/051573, filed on Sep. 11, 2020, and claims the benefit of the filing date of French Appl. No. 1910128, filed on Sep. 13, 2019.

TECHNICAL FIELD

The present invention relates to the crystalline reorganisation of thin films. It applies to the technical fields using thin films wherein the properties of these films are important for the application sought, such as for example in microelectronics, in optics, in engineering, for producing anticorrosion coatings, etc.

PRIOR ART

For numerous applications, in particular in the field of microelectronics, optics and engineering, it is necessary to be able to produce, on a substrate, a thin film of high crystalline quality. It is stated that, in the context of the present invention, thin film means a layer with a thickness generally less than 10 µm, generally between a few tens of nanometres and a few micrometres.

By way of example of an application requiring a thin film of high crystalline quality, mention can be made of synthesising films of heteroepitaxial diamond (i.e. quasi-monocrystalline diamond).

This synthesis is implemented on silicon substrates, covered with a fine layer of strontium titanate ($SrTiO_3$) (30 to 40 nm) on which a thin film of iridium (100 to 200 nm) is deposited. The crystalline quality of the diamond film is impacted by the quality of the layers that make up the substrate ($Ir/SrTiO_3/Si$) and more specifically by the quality of the layer of iridium.

At the present time, the thin film of iridium is deposited by a vacuum evaporation method on the substrate ($SrTiO_3/Si$), which is heated to around 700° C.

The quality of the thin film of iridium could be improved via thermal annealing but, as the melting point of silicon (1414° C.) is much below that of iridium (2410° C.), thermal annealing is not possible.

It would be advantageous to be able to reorganise (i.e. to recrystallise) the atoms of the layer of iridium at a temperature below the melting point of silicon and thus improve the crystalline quality of the layer of iridium.

However, generally, no method makes it possible, at the present time, to recrystallise, at temperatures below 1000° C., materials having a melting point above 2000° C.

Moreover, in some cases, the excessively high annealing temperature of the film causes degradations of the substrate on which the film is deposited. When the thin film is metallic, interdiffusion phenomena can thus be observed, which occur between the metallic thin film and the substrate, causing the formation of alloys.

DESCRIPTION OF THE INVENTION

The aim of the present invention is to overcome the drawbacks of the prior art. To do this, it proposes a method for treating a thin film made from a conductive or semiconductive material to improve the crystalline quality thereof, the method comprising the steps of:

supplying a substrate including, on one of the faces thereof, a thin film of said material; and biased plasma treatment of the assembly formed by the substrate and the thin film at a given temperature and for a given time, so as to obtain a crystalline reorganisation over a depth of the thin film, the biased plasma treatment comprising an electrical biasing of the thin film and an exposure of the film thus biased to a hydrogen plasma, the biased plasma treatment being implemented at a temperature that is below the melting points of the thin film and of the substrate;

the hydrogen plasma being obtained from a gas containing solely hydrogen, and optionally helium, the gas being devoid of any precursor of the conductive or semiconductive material of the film, and the time of exposure of the biased film to the hydrogen plasma being at least 10 minutes.

As the hydrogen plasma is obtained from a gas containing solely hydrogen, and optionally helium, the gas is devoid of any precursor of the conductive or semiconductive material of the film and there are therefore no risks of nucleation on the thin film.

The crystalline quality of an epitaxial thin film can be improved by a reduction of its mosaicity and/or better selectivity of its crystalline orientation and/or a reduction in structural defects (dislocations, macles, etc.). The crystalline quality of a polycrystalline thin film can be improved by favouring an increase in the size of the grains and/or by reducing the presence of structural defects (dislocations, macles, etc.).

Crystalline reorganisation of the thin film can occur over a depth of the thin film extending from the surface of the thin film.

Recrystallisation of the thin film occurs over a greater or lesser thickness of the film and may even project beyond the interface, a part of the underlying substrate also undergoing recrystallisation. Thus, depending on the thickness of the film and also the duration of treatment, it is possible to obtain a partial recrystallisation of the thickness of the film or a complete recrystallisation of the film, the recrystallisation being able to extend as far as the interface of the thin film with the underlying support.

Certain preferred but non-limitative aspects of this method are as follows:

the temperature of the biased plasma treatment is below 1200° C.;

electrical biasing of the thin film is obtained by applying to the film, to the substrate or, if the substrate is disposed on a substrate carrier, to the substrate carrier, a negative potential with respect to ground (generally with respect to the walls of the reactor, connected to ground) that is between −10 V and −1000 V;

the time of exposure of the biased film to the hydrogen plasma is between 10 minutes and several hours;

the biased plasma treatment is implemented at a pressure maintained at a value of between 10 and 200 mbar;

the thin film is made from iridium or molybdenum;

the plasma is generated by microwave waves at 2.45 GHz and the power injected into the plasma is between 200 and 2000 W;

at the supply step, the face of the substrate is monocrystalline and the thin film present on said face is polycrystalline, and the biased plasma treatment step is implemented until the polycrystalline film becomes an epitaxial film.

During the step of supplying the substrate including a thin film on one of the faces thereof, the thin film is generally deposited on a main face of the substrate. It is possible to use any deposition method generally used for depositing a thin film; it will generally be a vapour deposition method, such as chemical vapour deposition (CVD deposition) or a physical vapour deposition (PVD deposition).

For forming the hydrogen plasma, it is possible to use any known method. The plasma may be created using an energy source such as microwaves, radio frequency or a hot filament. In the method according to the invention, the deposition of the film and the biased plasma treatment (hydrogen plasma+biasing) will preferably be implemented in the same reactor. In the example embodiments that will follow, we have used an MPCVD (standing for "Microwave Plasma Chemical Vapour Deposition") microwave reactor, wherein a pressure of between 10 and 200 mbar is applied. The parameters for forming the hydrogen plasma are those habitually used for cleaning iridium surfaces before the biasing nucleation method for forming an epitaxial diamond film (bias enhanced nucleation or BEN step).

Advantageously, the method further comprises, between the supply step and the biased plasma treatment step, exposure of the non-biased film to a hydrogen plasma; this makes it possible to stabilise the temperature of the film before the biasing is applied; the non-biased film and the biased film will preferably be exposed to the same hydrogen plasma, i.e. that obtained by applying the same conditions of power, flow rate and pressure of the gas leading to the plasma.

BRIEF DESCRIPTION OF THE DRAWINGS

The present invention will be understood better from the reading of the description of example embodiments, given purely for indication and in no way limitatively, referring to the accompanying drawings, on which:

FIG. 2a is a view in cross-section of the sample 1 illustrated in FIG. 1a;

DETAILED DESCRIPTION OF PARTICULAR EMBODIMENTS

To illustrate the invention, we are now going to describe in detail several example embodiments wherein the thin films are made from iridium or molybdenum. However, it is obvious that the method according to the invention can apply to other types of conductive or semiconductive material.

It is also stated that, in all the example embodiments that will follow, we have proceeded in the following manner.

A substrate of size 7×7 mm$^2$ is introduced into an MPCVD (standing for "Microwave Plasma Chemical Vapour Deposition") reactor, provided with a biasing system, for biasing the substrate.

Initially, the reactor chamber is pumped in order to achieve a pressure of less than $2 \times 10^{-5}$ mbar, to limit the presence of chemical impurities (nitrogen and oxygen) in the gas phase. Next, the substrate is subjected to a hydrogen plasma without biasing. This step is optional and enables the surface temperature of the film to stabilise. This optional step is implemented under the following conditions:
microwave plasma power of 600 W;
gas flow at 250 sccm;
hydrogen pressure of 18 mbar;
duration 20 minutes.

At the end of this step and continuing on therefrom, the substrate is subjected to a hydrogen plasma with biasing in accordance with the following conditions, but for a period of 1 hour, applying to the substrate a biasing voltage of −280 V.

According to a first example embodiment, a deposition of a thin film of polycrystalline iridium, with a thickness of approximately 200 nm, is implemented by PVD (standing for "Physical Vapour Deposition") simultaneously on three substrates of $SrTiO_3$(40 nm)/Si(001), in order to obtain the same morphology on the three substrates. Samples 1, 2 and 3 are thus obtained.

It should be noted that we have here chosen to deposit a polycrystalline thin film since recrystallisation is more remarkable on a polycrystalline film, the recrystallisation leading to an increase in the size of the grains with a fairly spectacular effect. However, a recrystallisation leading to an improvement in the crystalline quality will also take place if the thin film is epitaxial or monocrystalline.

Sample 1 serves as a reference.

Sample 2 is subjected to an annealing under secondary vacuum at a temperature of 875° C. for a period of 1 hour.

Sample 3 is subjected to a hydrogen plasma treatment coupled with a biasing in accordance with the conditions described above. The temperature during this treatment was 850° C.

The temperature for samples 2 and 3 was measured with a pyrometer, the emissivity of which was adjusted to 19% (that of iridium).

First observations of the surface and in cross-section, taken under scanning electron microscopy (SEM; acceleration voltage of 20 kV), were implemented for each of these three samples at the end of any treatment thereof.

Figure 1A:
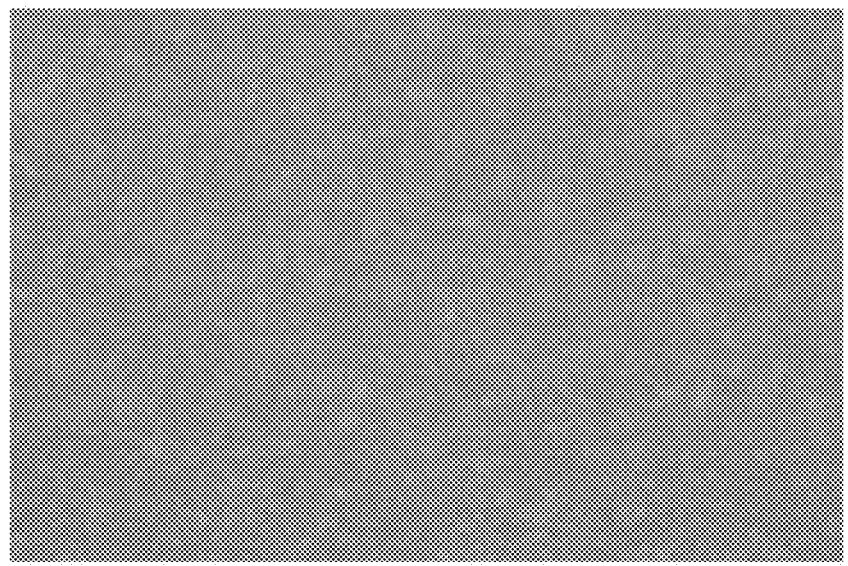
FIG. 1a shows, in a plan view, an SEM observation of the morphology of a polycrystalline iridium film of a first example embodiment, FIG. 1a showing the reference sample 1.
Figure 1B:
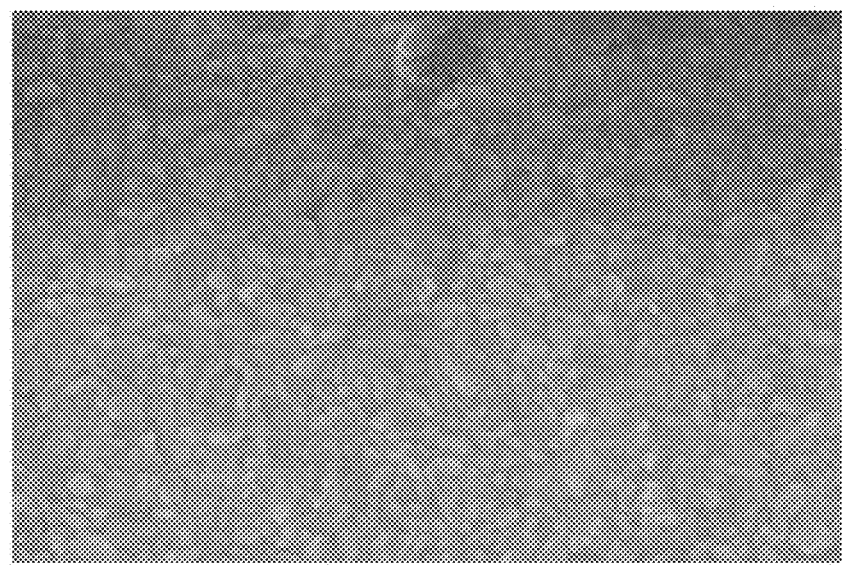
FIG. 1b shows, in a plan view, an SEM observation of the morphology of the polycrystalline iridium film of the first example embodiment, FIG. 1b showing the sample 2 (after annealing)
Figure 1C:
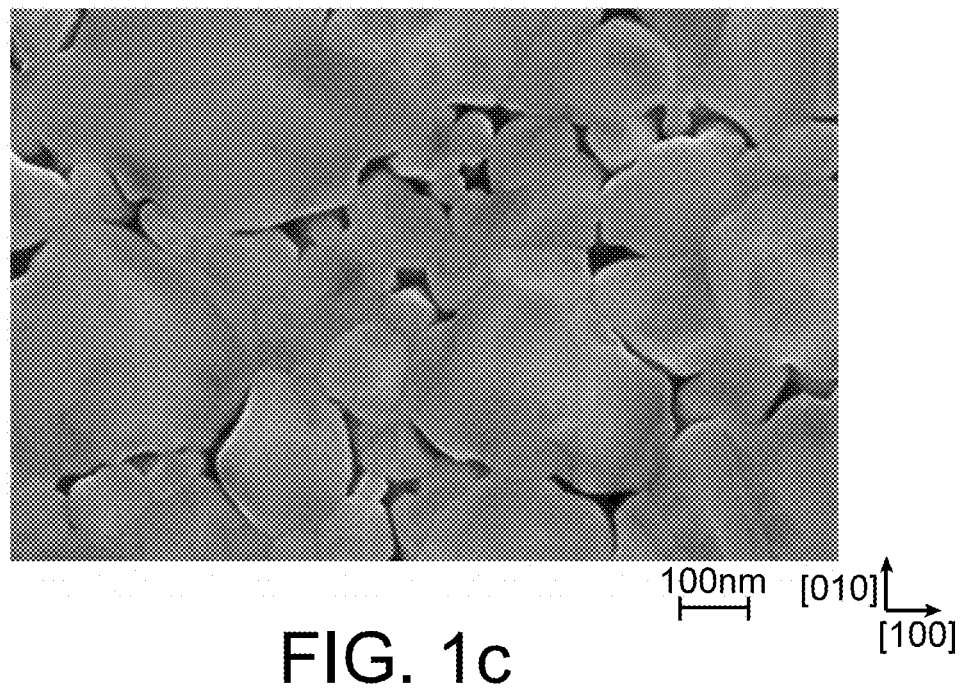
FIG. 1c shows, in a plan view, an SEM observation of the morphology of the polycrystalline iridium film of the first example embodiment, FIG. 1c showing the sample 3 (after a treatment according to the invention (hydrogen plasma coupled with a biasing))
Figure 2A:
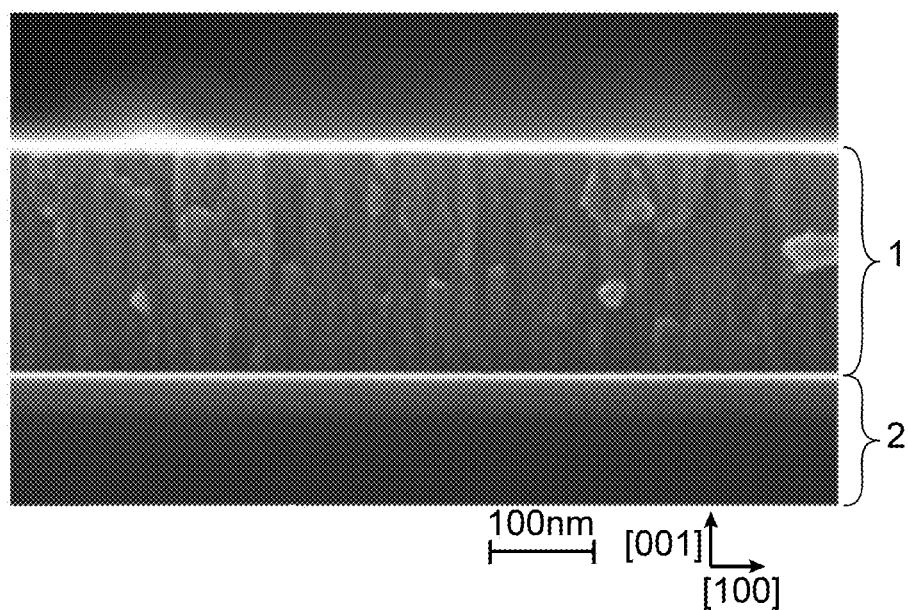
Figure 2B:
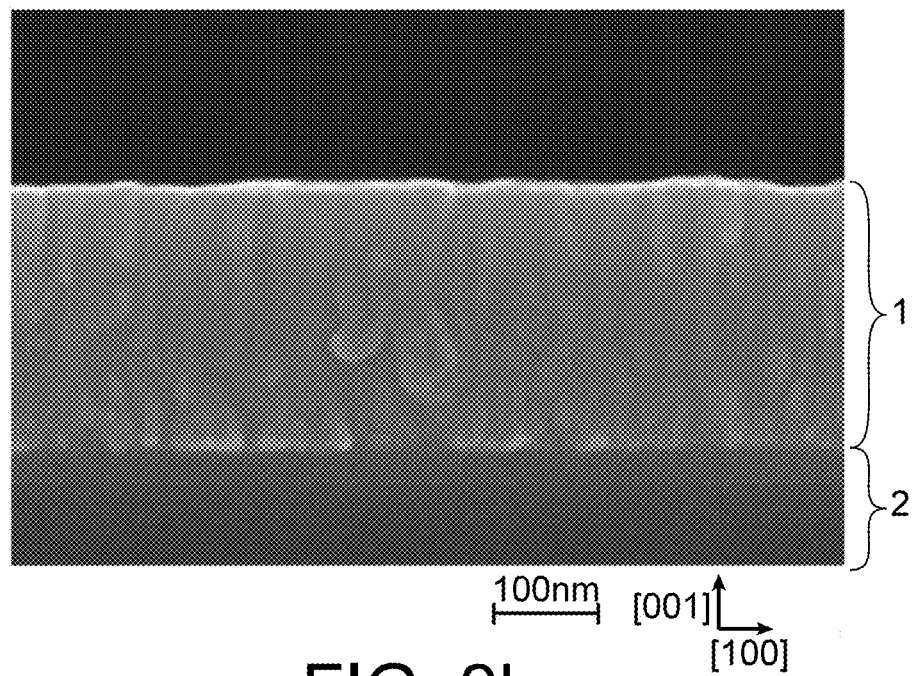
FIG. 2b is a view in cross-section of the sample 2 illustrated in FIG. 1b.
Figure 2C:
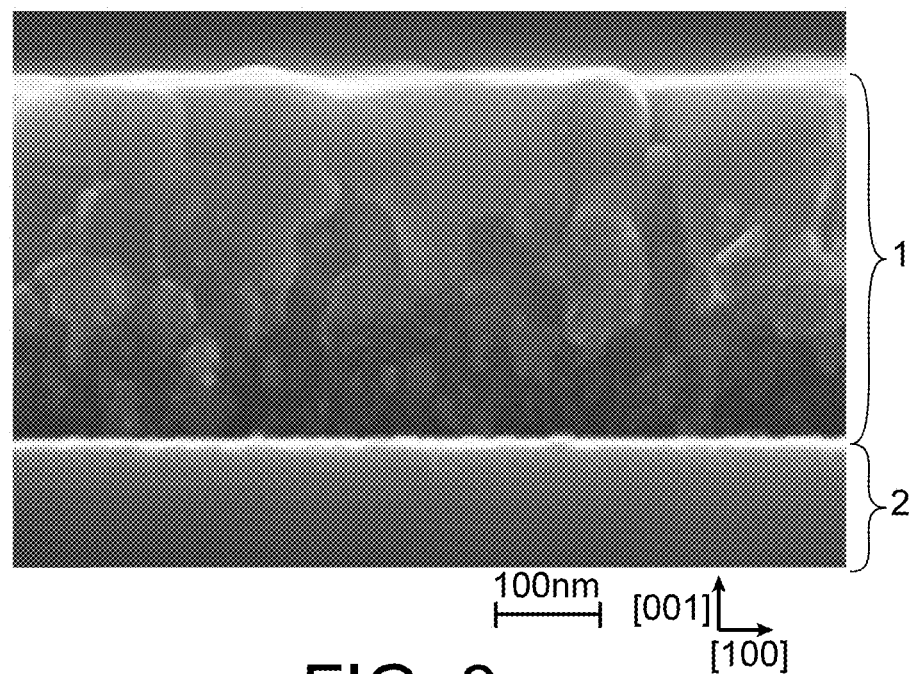
FIG. 2c is a view in cross-section of the sample 3 illustrated in FIG. 1c.

FIGS. 1a and 2a are respectively the SEM observations of the surface and in cross-section of the reference sample (sample 1); FIGS. 1b and 2b those of the surface and in cross-section of the sample that underwent annealing (sample 2); FIGS. 1c and 2c those of the surface and in cross-section of the sample subjected to the treatment according to the invention (hydrogen plasma coupled with a biasing) (sample 3).

In these FIGS. 1a-1c and 2a-2c, the thin film is designated by the reference 1 and the substrate is designated by the reference 2.

By comparing these SEM observations, it is found that, in the sample 2 that underwent an annealing under secondary vacuum, the grain size of around ten nanometres corresponds to the size observed on a starting deposition of iridium (sample 1); on the contrary, in sample 3 (hydrogen plasma+biasing), an enlarging of the iridium grains is noted, the grains having a size close to a hundred nanometres.

Figure 3A:
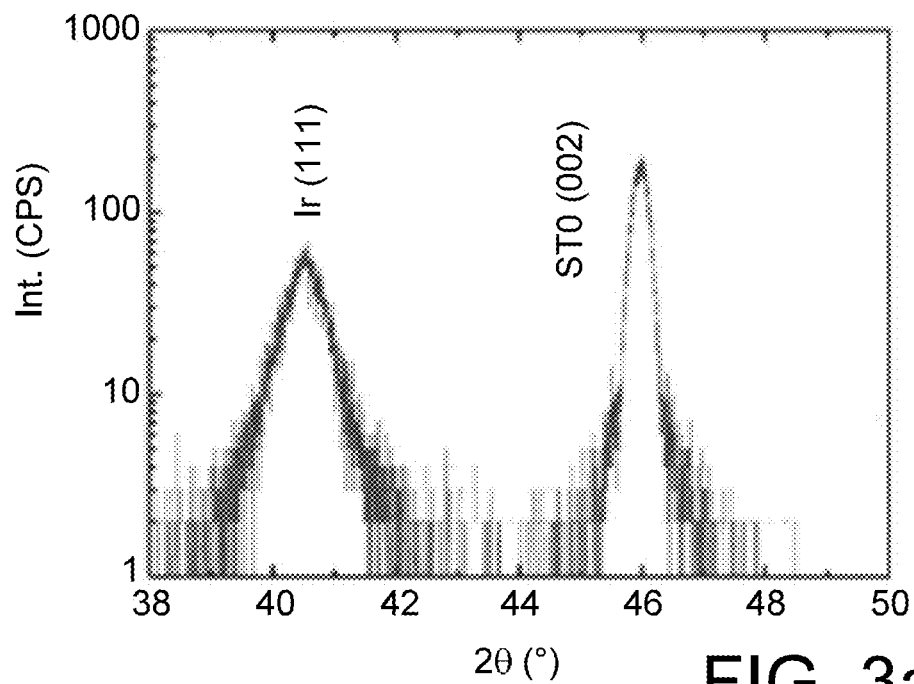
FIG. 3a shows an XRD analysis implemented on the sample 1.
Figure 3B:
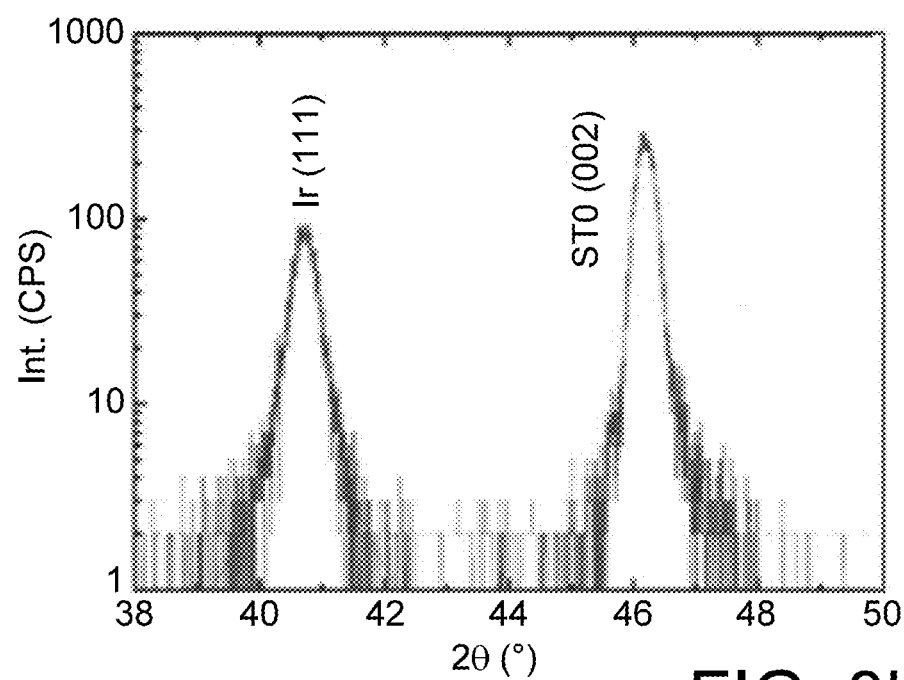
FIG. 3b shows an XRD analysis implemented on the sample 2.
Figure 3C:
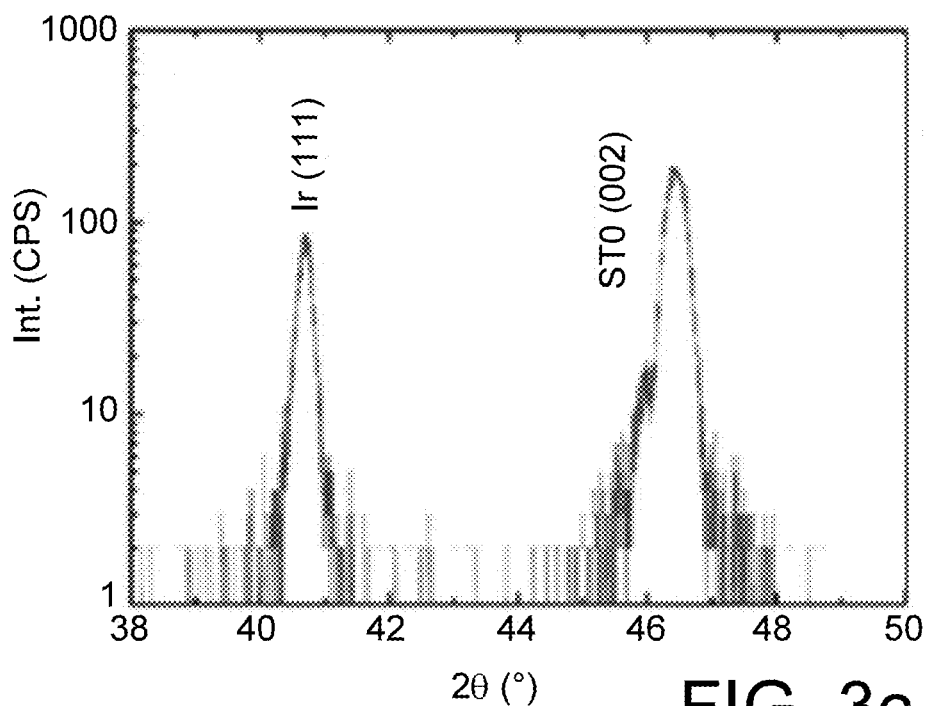
FIG. 3c shows an XRD analysis implemented on the sample 3.

Supplementary XRD (X-ray diffraction) measurements were made on these three samples, in order to confirm the recrystallisation that took place for sample 3. These measurements are presented in FIGS. 3a-3c (FIG. 3a: sample 1; FIG. 3b: sample 2; FIG. 3c: sample 3).

It is found that, in the three samples, the thin film has an orientation (111), without traces of orientation (001).

The width of the diffraction peaks of Ir(111) exhibits a refinement when a plasma coupled with a biasing is applied (sample 3). The widths at half maximum (FWHM) of the Ir(111) peaks are as follows:
0.7° for sample 1;
0.43° for sample 2;
0.22° for sample 3.

In these three samples, the diffraction peak of STO(002), i.e. of $SrTiO_3$, underlying the iridium thin film, does not undergo any change.

In order to complete this demonstration, we have also shown that the plasma alone (i.e. without biasing) does not make it possible to reorganise the crystalline lattice of the iridium film.

Thus, according to a second example embodiment, we first of all deposited, by electron beam evaporation, 160 nm of monocrystalline iridium on an $SrTiO_3$(40 nm)/Si(001) substrate. Next, we deposited a film of polycrystalline iridium 97 nm thick by PVD, thus obtaining sample 4. Four successive treatments were implemented on this same sample 4, namely:
an annealing under vacuum at 860° C. for 1 h;
a hydrogen plasma treatment (600 W, 250 cc, 18 mbar, 800° C.) for 1 h;
a hydrogen plasma treatment+biasing (600 W, 250 cc, 18 mbar, −250 V, 820° C.) for 30 min;
a hydrogen plasma treatment+biasing (600 W, 250 cc, 18 mbar, −280 V, 835° C.) for 1 h.

Figure 4A:
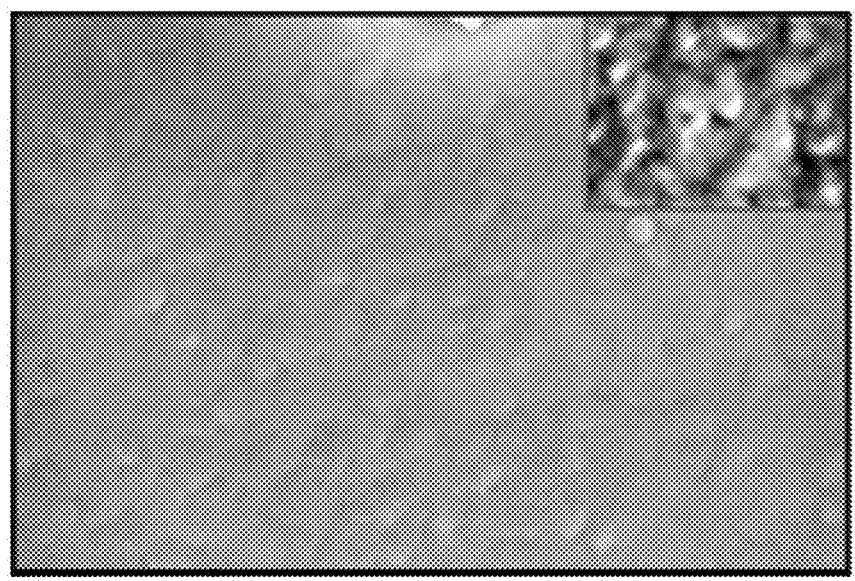
FIG. 4a shows, in a plan view, an SEM observation of an iridium film produced according to a second embodiment, this analysis being implemented on the same zone of the iridium film, before any treatment.
Figure 4B:
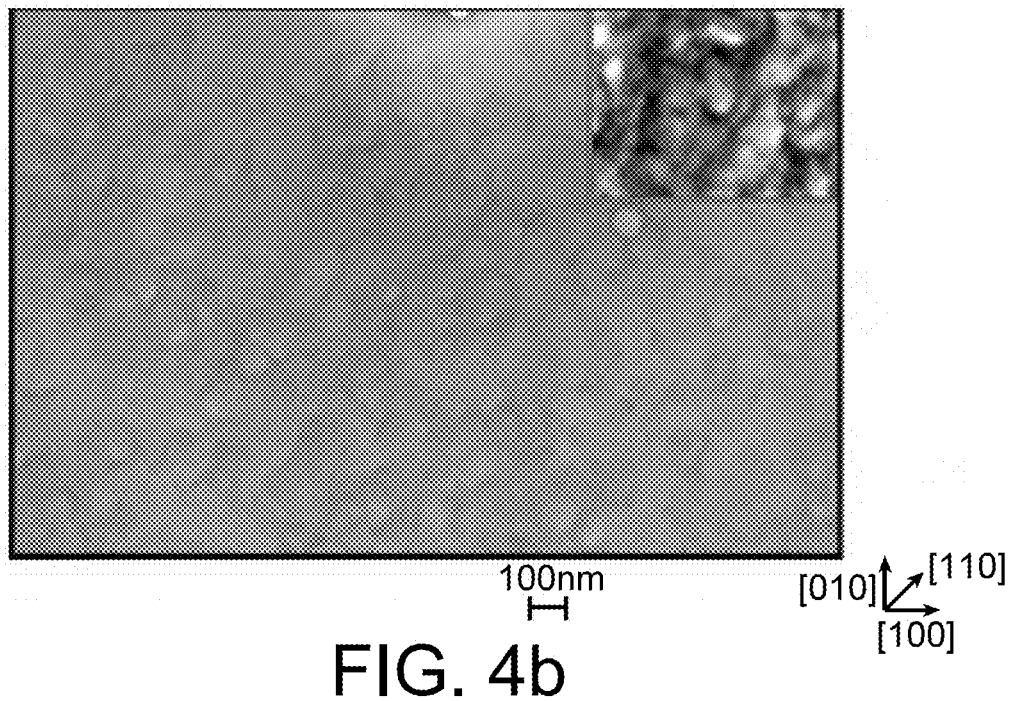
FIG. 4b shows, in a plan view, an SEM observation of the iridium film implemented on the second embodiment, this analysis being implemented on the same zone of the iridium film, after a vacuum annealing.
Figure 4C:
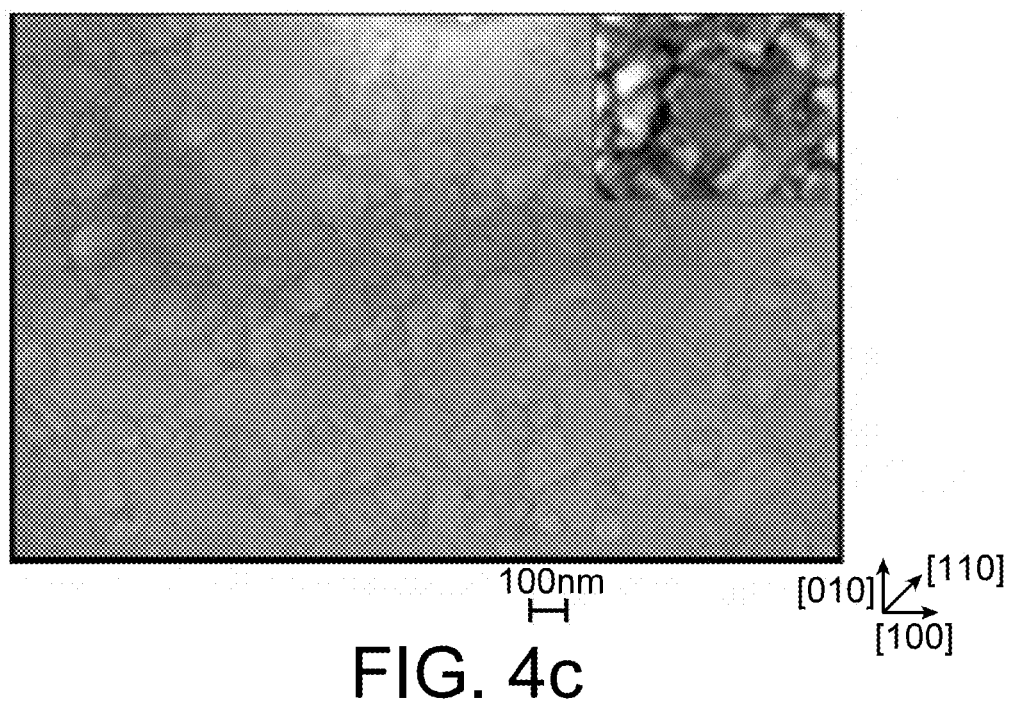
FIG. 4c shows, in a plan view, an SEM observation of the iridium film produced according to the second embodiment, this analysis being implemented on the same zone of the iridium film, after treatment by hydrogen plasma alone.
Figure 4D:
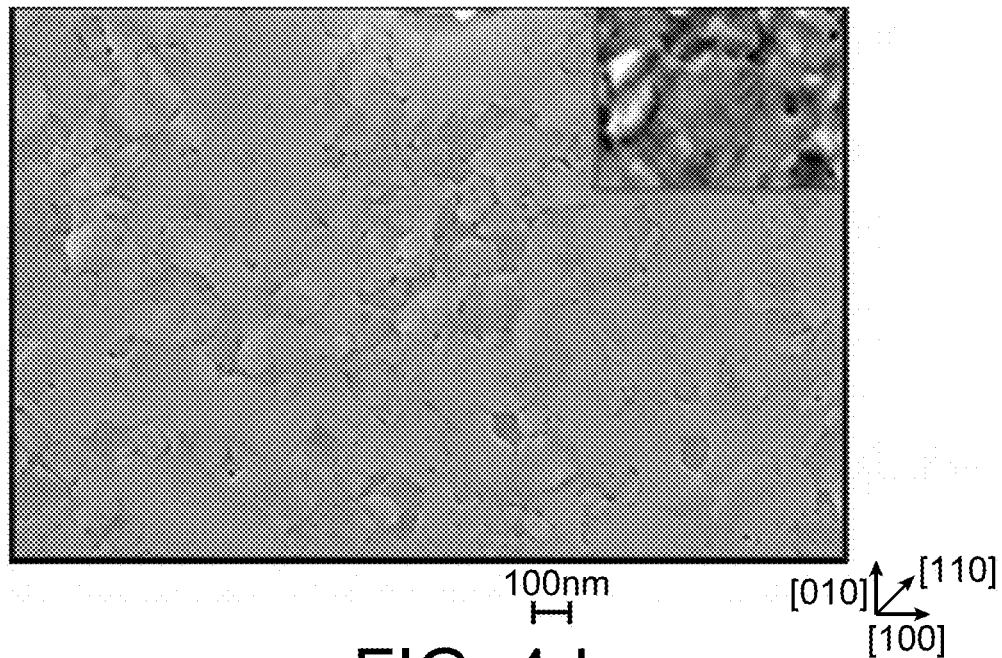
FIG. 4d shows, in a plan view, an SEM observation of the iridium film produced according to the second embodiment, this analysis being implemented on the same zone of the iridium film, after a first hydrogen plasma treatment coupled with a biasing.
Figure 4E:
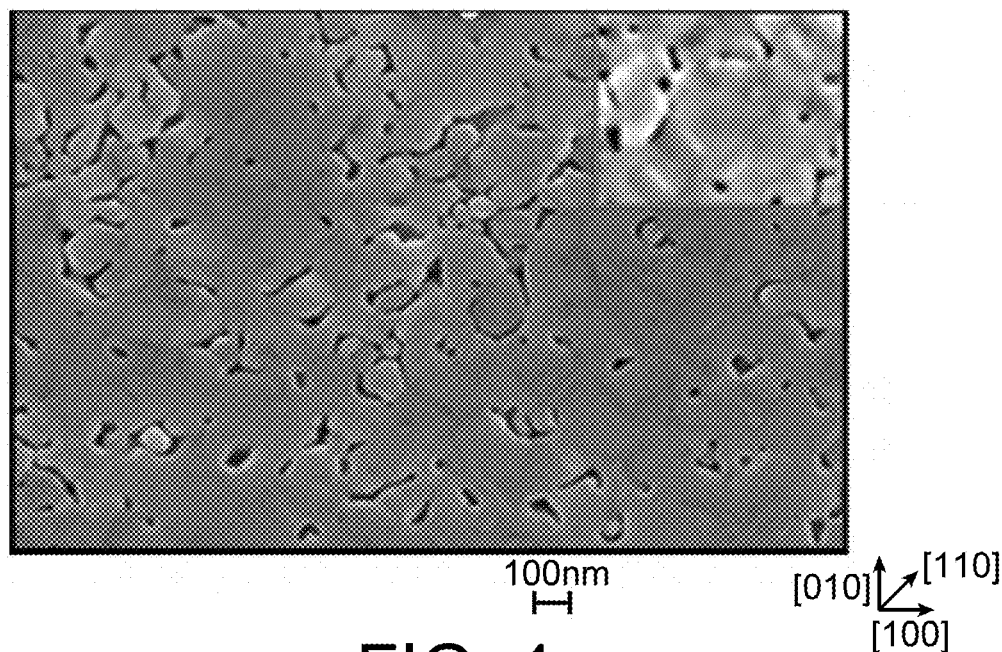
FIG. 4e shows, in a plan view, an SEM observation of the iridium film produced according to the second embodiment, this analysis being implemented on the same zone of the iridium film, after a second hydrogen plasma treatment coupled with a biasing.

SEM observations (acceleration of voltage 20 kV) of the morphology of the iridium film by returning to zone, before the first treatment (FIG. 4a) and after each treatment (FIGS. 4b-4e), were implemented. A bandpass filter was applied in a frame at the top right of the SEM images to show the change in the surface morphology. These SEM images made it possible to reveal that changes take place only after the step of hydrogen plasma coupled with a biasing (FIGS. 4d and 4e).

It is also found that, after the hydrogen plasma step coupled with a biasing (FIGS. 4d and 4e), striations are observable in the <110> directions. These are characteristic of an orientation of the iridium(001) film, showing thus the change in the polycrystalline iridium film into a monocrystalline iridium film after the treatment described here. The thin film of polycrystalline iridium has therefore transformed into a thin film of monocrystalline iridium in homoepitaxy with the underlying monocrystalline iridium layer. The method that is the object of the invention therefore makes it possible to create here a relationship of epitaxy between the deposited thin film and the substrate.

Moreover, weighings of the sample 4 by microbalance after each of the four treatments showed that there were no losses of material following these treatments.

According to a third example embodiment, the same strategy was employed for producing a thin film of polycrystalline molybdenum (of approximately 120 nm) deposited by PVD on two $Si_3N_4$(20 nm)/Si substrates, thus obtaining two samples (sample 5 and sample 6).

Sample 5 was subjected to the method according to the invention (hydrogen plasma+biasing) for 1 h (gas 100% $H_2$, 600 W, 250 cc, 18 mbar, −280 V). The temperature during this method was measured with the same pyrometer as before, the emissivity of which was fixed at 19% (that of iridium and not molybdenum). The temperature measured (930° C.) is "fictitious" (it can also be said that it is erroneous), since it does not correspond to the emissivity of molybdenum (which we do not know for this temperature range). However, the experimental conditions that generate the plasma being the same as those applied for the example embodiment with iridium, it is supposed that the temperature during this method is equivalent to that of iridium.

This fictional temperature enables us in any event to know that, to make a comparison with an annealing, it will be necessary to heat to a fictional temperature greater than 930° C. An annealing under secondary vacuum at a fictional temperature of 942° C. for 1 h was therefore implemented on sample 6.

Figure 5A:
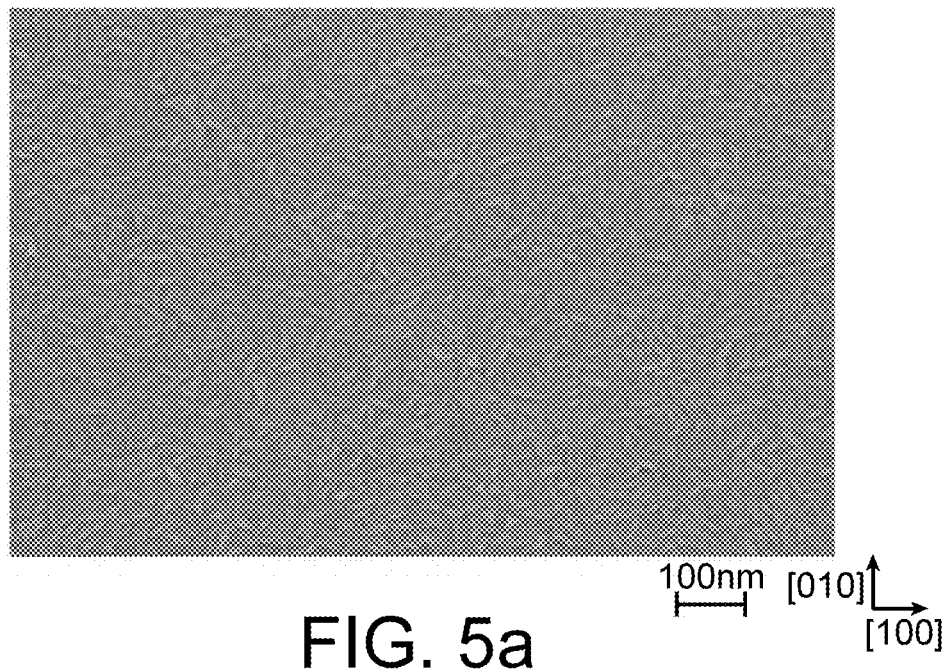
FIG. 5a shows, in a plan view, an SEM observation of the morphology of the polycrystalline molybdenum film (sample 5) implemented according to the third embodiment, before any treatment.
Figure 5B:
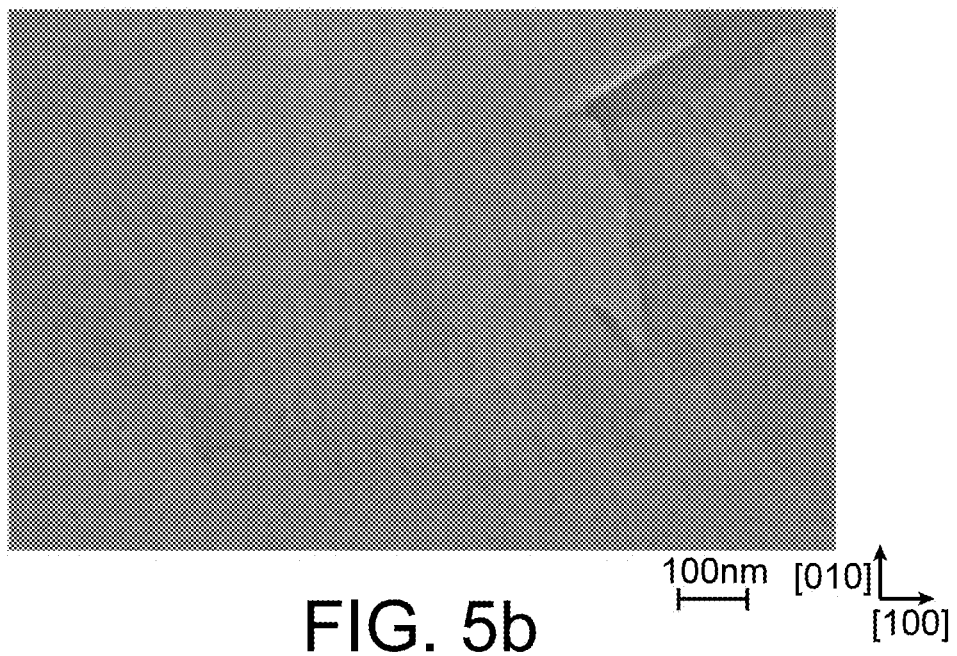
FIG. 5b shows, in a plan view, an SEM observation of the morphology of the polycrystalline molybdenum film (sample 5) implemented according to the third embodiment, after treatment according to the invention (hydrogen plasma coupled with a biasing)
Figure 6A:
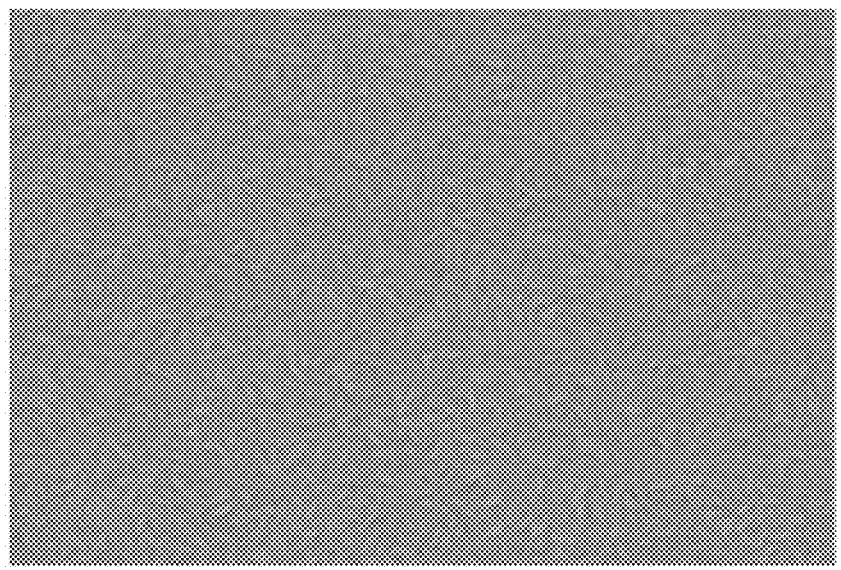
FIG. 6a shows, in a plan view, an SEM observation of the morphology of the polycrystalline molybdenum film (sample 6) implemented according to the third embodiment, before any treatment.
Figure 6B:
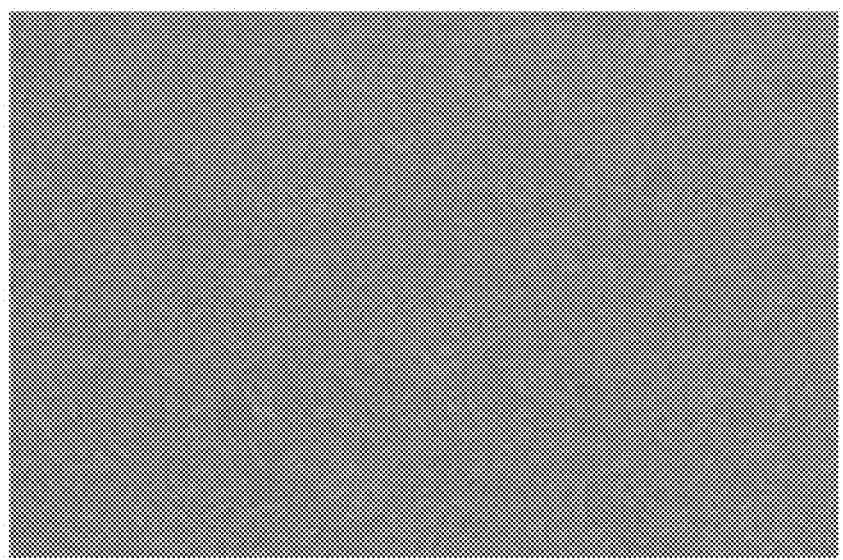
FIG. 6b shows, in a plan view, an SEM observation of the morphology of the polycrystalline molybdenum film (sample 6) implemented according to the third embodiment, after an annealing.

SEM observations (20 kV) by returning to zones of the surface of the molybdenum film were made on each of these two samples. FIGS. 5a and 6a show the morphology of the starting polycrystalline molybdenum film, respectively for sample 5 and for sample 6; FIGS. 5b and 6b show the morphology of the molybdenum film, respectively after the hydrogen plasma treatment coupled with biasing (sample 5) and after annealing (sample 6).

Comparing these various figures reveals the recrystallisation of the molybdenum. There also, the effect is fairly spectacular, since the grains had a size of approximately 10 to 20 nm before the method (FIGS. 5a and 6a), and then several hundreds of nanometres after the treatment (FIG. 5b).

According to a fourth example embodiment, we implemented the treatment according to the invention on an epitaxial iridium film with a thickness of approximately 109 nm deposited by electron beam evaporation on an $SrTiO_3$(40 nm)/Si(001) substrate.

Figure 7A:
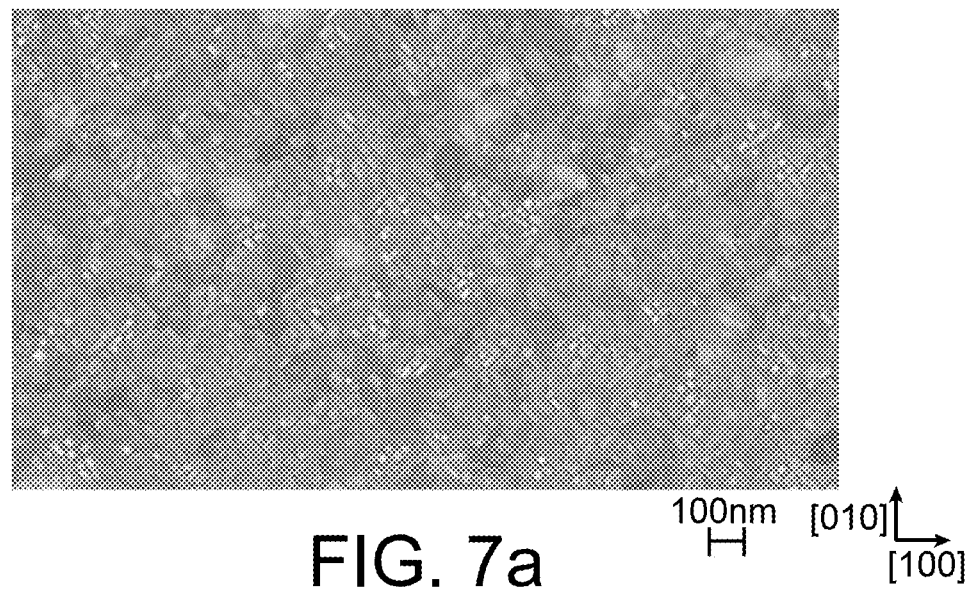
FIG. 7a shows, in a plan view, an SEM observation of the morphology of a monocrystalline iridium film implemented according to a fourth embodiment, before the treatment according to the invention.
Figure 7B:
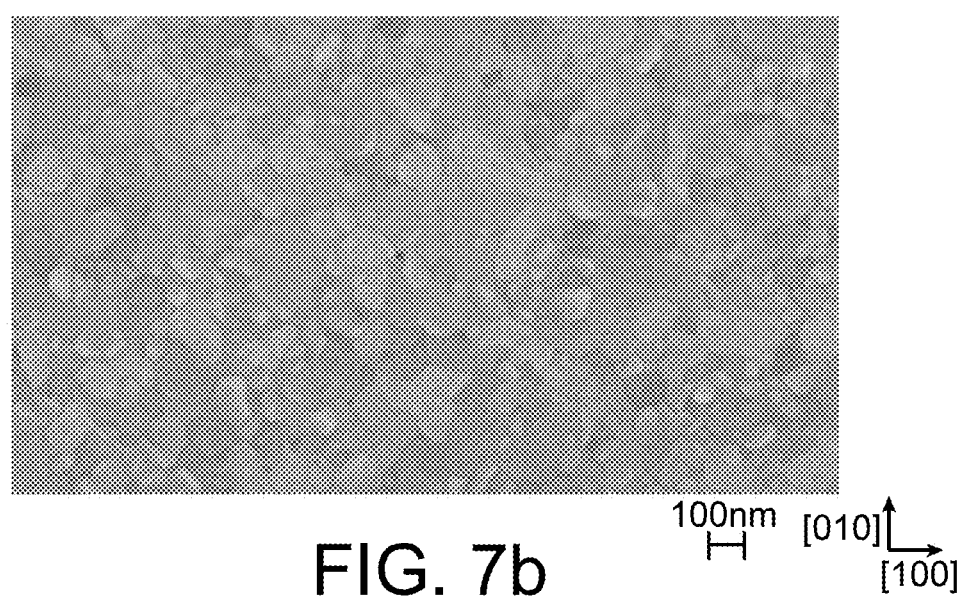
FIG. 7b shows, in a plan view, an SEM observation of the morphology of the monocrystalline iridium film implemented according to the fourth embodiment, after the treatment according to the invention (hydrogen plasma coupled with a biasing)
Figure 8A:
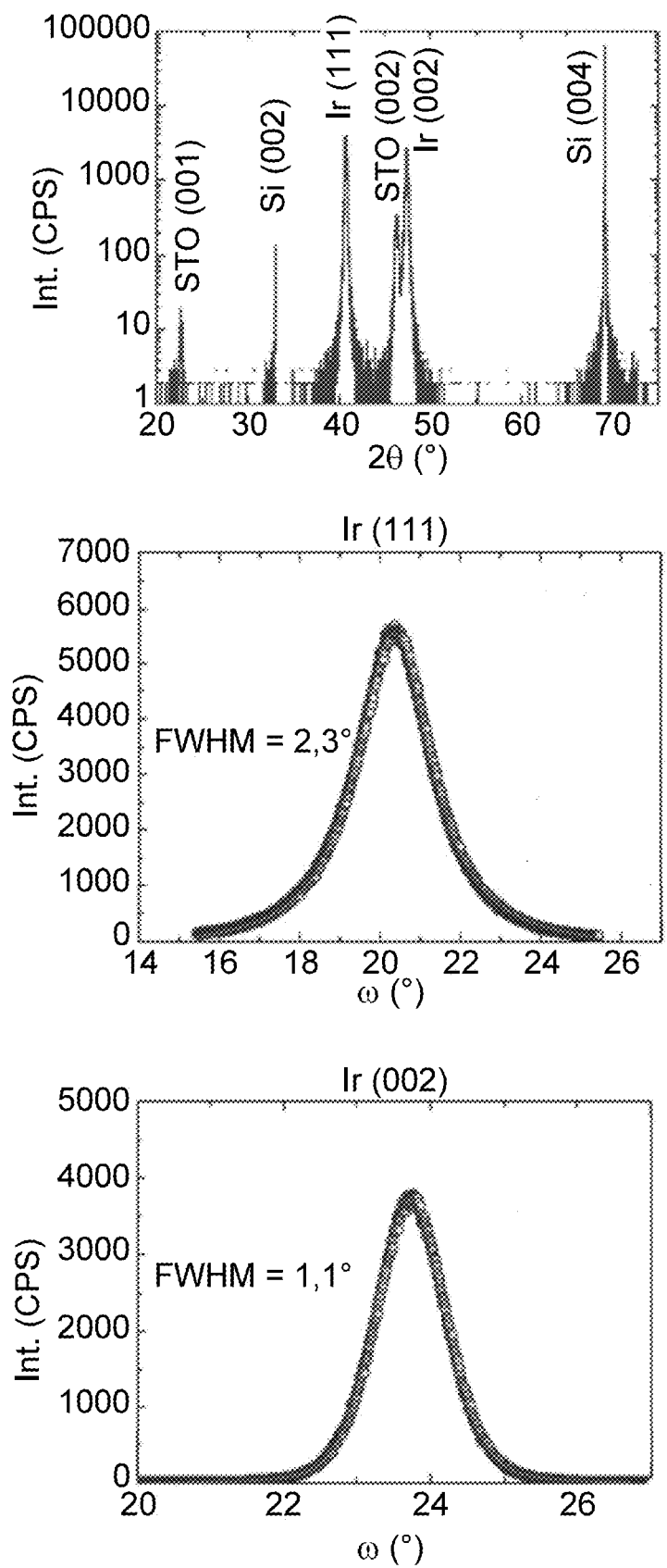
FIG. 8a shows an XRD analysis of said monocrystalline iridium film implemented according to the fourth embodiment, before the treatment according to the invention.

SEM observations (20 kV) and XRD measurements before and after this treatment showed the improvement in the crystalline quality of the film (respectively FIGS. 7a (before) and 7b (after) for the SEM observations and FIGS. 8a (before) and 8b (after) for the XRD measurements.

Figure 8B:
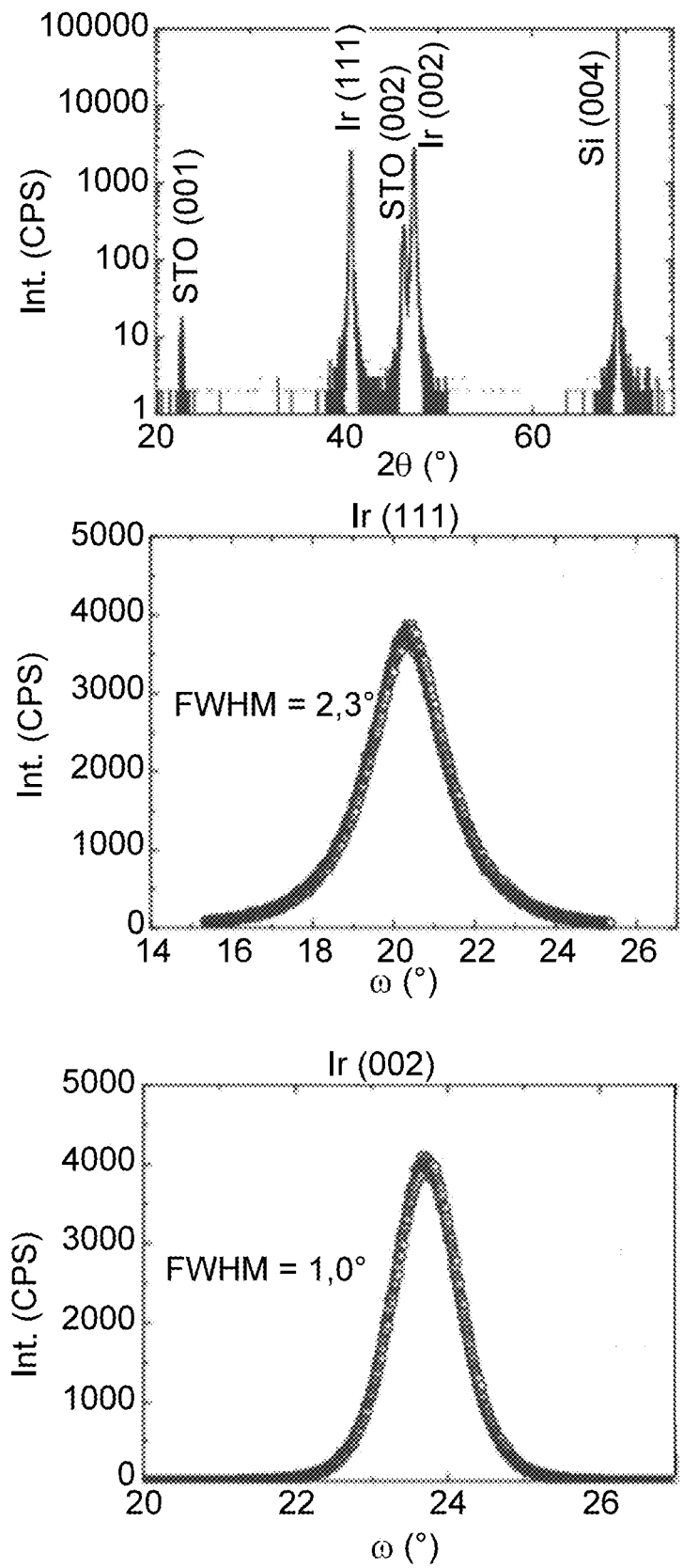
FIG. 8b shows an XRD analysis of said monocrystalline iridium film implemented according to the fourth embodiment, after the biased plasma treatment according to the invention.

It is stated that, in FIGS. 8a and 8b, the graphs at the top are general graphs, the other graphs being zooms on particular portions of the general graphs with a zoom on Ir(111) (graph in the middle) and a zoom on Ir(002) (graph at the bottom).

The Ir(002) diffraction peak was used for these analyses, but we shall rather speak of (001) orientation hereinafter, these two orientations forming part of the same family of planes.

Analysing the XRD measurements shows a coexistence of orientations (001) and (111), in a proportion of 65.2% for Ir(002) or Ir(001) and 34.8% for Ir(111), in the sample before the application of the method according to the invention. After application of the method according to the invention ($H_2$ plasma treatment coupled with a biasing), the proportion of orientation (001) increases to 74.4% and the orientation (111) decreases to 25.6%. Analysing these measurements shows us clearly that the $H_2$ plasma treatment coupled with a biasing has an influence on the crystalline quality of iridium.

In conclusion, the SEM observations and the XRD measurements made for the example embodiments described above enable us to reveal the recrystallisation of the thin films of iridium and molybdenum through the use of a hydrogen plasma coupled with a biasing, compared with an annealing implemented under secondary vacuum. We have thus shown that the method according to the invention causes a reorganisation of the crystalline lattice of the nanocrystalline films of iridium and molybdenum.

One of the advantages of the method that is the object of the invention is that the hydrogen plasma treatment coupled with a biasing of the substrate is implemented at a much lower temperature (below 1000° C. in the case of iridium and molybdenum) than the melting points of the thin layer (2410° C. and 2617° C., respectively, for iridium and molybdenum). The rearrangement of the iridium and molybdenum atoms cannot therefore be explained by the addition of thermal energy of annealing, but rather by different mechanisms (ion bombardment by $H^+$ ions, diffusion of hydrogen, chemical reactivity of hydrogen with the iridium and molybdenum atoms, etc.).

Thus the method in accordance with the invention makes it possible to improve the crystalline quality of a thin film at relatively low treatment temperatures (between 500° C. and 1000° C.), which are well below the usual temperatures used during "standard" thermal annealing treatments, provided that they can be used according to the melting point of the substrate selected. We know in fact that some materials have a high melting point, in particular for refractory metals (>2000° C.) and the thermal annealing method generally used for reorganising the crystalline lattice cannot therefore be envisaged if these metals are deposited in the form of thin films on a substrate the melting point of which is greatly different from that of the refractory metal.

The advantage of this method also lies in the fact that the crystalline reorganisation can occur as from the surface of the thin film and over a limited depth of the thin film, which depends on the experimental conditions applied. Thus, if the thin film is sufficiently thick, the underlying substrate is not impacted by this reorganisation.

It is also possible to imagine having a sufficiently thin layer so as also to obtain a reorganisation of the lattice close to the interface, either to favour the diffusion of elements close to the interface, or to favour relationships of epitaxy between the substrate and the film. By favouring the relationships of epitaxy between the substrate and the film, there is then a novel way of synthesising epitaxial films (depositing a polycrystalline on a monocrystal, and then applying the method according to the invention for reorganising the polycrystalline film so as to form an epitaxial film with the substrate).

The invention claimed is:

1. A method for treating a thin film made from a conductive or semiconductive material to improve the crystalline quality thereof, the method comprising:

supplying a substrate comprising, on one of the faces thereof, a thin film of the material; and biased plasma treating the assembly formed by the substrate and the thin film at a given temperature and for a given time, so as to obtain a crystalline reorganization over a depth of the thin film, wherein the biased plasma treating comprises an electrical biasing of the thin film and exposing the film thus biased to a hydrogen plasma, wherein the biased plasma treating is implemented at a temperature that is below the melting points of the thin film and of the substrate, wherein the hydrogen plasma is obtained from a gas containing solely hydrogen, wherein the gas is devoid of any precursor of the conductive or semiconductive material of the film, wherein a time of the exposure of the biased film to the hydrogen plasma is in a range of from 10 minutes to several hours, wherein, in the supplying, the face of the substrate is monocrystalline and the thin film present on the face is polycrystalline, and wherein the biased plasma treating is implemented until the polycrystalline film becomes an epitaxial film.

2. The method of claim 1, wherein the biased plasma treating is conducted at a temperature below 1200° C.

3. The method of claim 1, wherein the electrical biasing of the thin film is obtained by applying to the film, to the substrate or, if the substrate is disposed on a substrate carrier, to the substrate carrier, a negative potential, with respect to ground, in a range of from −10 to −1000V.

4. The method of claim 1, wherein the exposing of the biased film to the hydrogen plasma is conducted for a time in a range of from 10 minutes to 2 hours.

5. The method of claim 1, wherein the biased plasma treating is implemented at a pressure maintained in a range of from 10 to 200 mbar.

6. The method of claim 1, wherein the thin film is made from iridium.

7. The method of claim 1, wherein the plasma is generated by microwave waves at 2.45 GHz and the power injected into the plasma is in a range of from 200 to 2000 W.

8. The method of claim 1, wherein the thin film comprises iridium.

9. The method of claim 1, wherein the thin film comprises molybdenum.

10. The method of claim 1, wherein the thin film is made from molybdenum.

11. A method for treating a thin film made from a conductive or semiconductive material to improve the crystalline quality thereof, the method comprising:
   supplying a substrate comprising, on one of the faces thereof, a thin film of the material; and
   biased plasma treating the assembly formed by the substrate and the thin film at a given temperature and for a given time, so as to obtain a crystalline reorganization over a depth of the thin film,
   wherein the biased plasma treating comprises an electrical biasing of the thin film and exposing the film thus biased to a hydrogen plasma,
   wherein the biased plasma treating is implemented at a temperature that is below the melting points of the thin film and of the substrate,
   wherein the hydrogen plasma is obtained from a gas consisting of hydrogen and helium,
   wherein the gas is devoid of any precursor of the conductive or semiconductive material of the film,
   wherein a time of the exposure of the biased film to the hydrogen plasma is in a range of from 10 minutes to several hours,
   wherein, in the supplying, the face of the substrate is monocrystalline and the thin film present on the face is polycrystalline, and
   wherein the biased plasma treating is implemented until the polycrystalline film becomes an epitaxial film.

12. The method of claim 11, wherein the biased plasma treating is conducted at a temperature below 1200° C.

13. The method of claim 11, wherein the electrical biasing of the thin film is obtained by applying to the film, to the substrate or, if the substrate is disposed on a substrate carrier, to the substrate carrier, a negative potential, with respect to ground, in a range of from −10 to −1000V.

14. The method of claim 11, wherein the exposing of the biased film to the hydrogen plasma is conducted for a time in a range of from 10 minutes to 2 hours.

15. The method of claim 11, wherein the biased plasma treating is implemented at a pressure maintained in a range of from 10 to 200 mbar.

16. The method of claim 11, wherein the thin film is made from iridium.

17. The method of claim 11, wherein the plasma is generated by microwave waves at 2.45 GHz and the power injected into the plasma is in a range of from 200 to 2000 W.

18. The method of claim 11, wherein the thin film comprises iridium.

19. The method of claim 11, wherein the thin film comprises molybdenum.

20. The method of claim 11, wherein the thin film is made from molybdenum.

* * * * *